(12) United States Patent
Fuller et al.

(10) Patent No.: US 7,352,064 B2
(45) Date of Patent: Apr. 1, 2008

(54) MULTIPLE LAYER RESIST SCHEME IMPLEMENTING ETCH RECIPE PARTICULAR TO EACH LAYER

(75) Inventors: Nicholas C. M. Fuller, Elmsford, NY (US); Timothy J. Dalton, Ridgefield, CT (US); Raymond Joy, Singapore (SG); Yi-hsiung Lin, Fishkill, NY (US); Chun Hui Low, Johor (MY)

(73) Assignee: International Business Machines Corporation, Armonk, NY (US)

( * ) Notice: Subject to any disclaimer, the term of this patent is extended or adjusted under 35 U.S.C. 154(b) by 264 days.

(21) Appl. No.: 10/904,323

(22) Filed: Nov. 4, 2004

(65) Prior Publication Data

US 2006/0094230 A1   May 4, 2006

(51) Int. Cl.
  *H01L 23/48* (2006.01)
  *H01L 23/52* (2006.01)
  *H01L 29/40* (2006.01)
  *H01L 21/4763* (2006.01)

(52) U.S. Cl. ............ 257/750; 257/758; 257/760; 257/E21.252; 257/E21.579; 438/637; 438/618; 438/639

(58) Field of Classification Search ............ 257/758, 257/760, E21.252, E21.579, 750; 438/637–639
See application file for complete search history.

(56) References Cited

U.S. PATENT DOCUMENTS

| | | | | |
|---|---|---|---|---|
| 4,790,903 A * | 12/1988 | Sugano et al. | ............ | 438/712 |
| 5,632,910 A * | 5/1997 | Nagayama et al. | ............ | 216/47 |
| 6,387,789 B1 * | 5/2002 | Kim | ............ | 438/592 |
| 6,429,140 B1 * | 8/2002 | Ha et al. | ............ | 438/717 |
| 6,632,746 B2 * | 10/2003 | Kanegae et al. | ............ | 438/706 |
| 6,809,032 B1 * | 10/2004 | Mauersberger et al. | ............ | 438/692 |
| 6,898,851 B2 * | 5/2005 | Nishioka et al. | ............ | 29/852 |
| 6,958,540 B2 * | 10/2005 | Gambino et al. | ............ | 257/750 |
| 7,091,612 B2 * | 8/2006 | Kumar et al. | ............ | 257/758 |
| 2003/0082905 A1 * | 5/2003 | Hung et al. | ............ | 438/633 |
| 2003/0164354 A1 * | 9/2003 | Hsieh et al. | ............ | 216/22 |
| 2004/0110369 A1 * | 6/2004 | Jiang et al. | ............ | 438/637 |
| 2004/0214430 A1 * | 10/2004 | Ruelke et al. | ............ | 438/687 |
| 2004/0266201 A1 | 12/2004 | Wille et al. | | |
| 2005/0085077 A1 * | 4/2005 | Ogawa et al. | ............ | 438/689 |
| 2005/0101137 A1 * | 5/2005 | Kato et al. | ............ | 438/689 |
| 2005/0266355 A1 * | 12/2005 | Matsui et al. | ............ | 430/323 |

(Continued)

*Primary Examiner*—B. William Baumeister
*Assistant Examiner*—Igwe U. Anya
(74) *Attorney, Agent, or Firm*—Steven Capella; Hoffman, Warnick & D'Alessandro LLC

(57) ABSTRACT

Methods of forming a metal line and/or via critical dimension (CD) in a single or dual damascene process on a semiconductor substrate, and the resist scheme implemented, are disclosed. The method includes forming a multiple layer resist scheme including a first planarizing layer of a first type material over the substrate, a second dielectric layer of a second type material over the planarizing layer, and a third photoresist layer of a third type material over the dielectric layer. The types of material alternate between organic and inorganic material. The third layer is patterned for the metal line and/or via CD. Sequential etching to form the metal line and/or via critical dimension using a tailored etch recipe particular to each of the first photoresist layer, the second dielectric layer and the third planarizing layer as each layer is exposed is then used. Accurate CD formation and adequate resist budget are provided.

7 Claims, 4 Drawing Sheets

U.S. PATENT DOCUMENTS

2005/0266691 A1* 12/2005 Gu et al. .................... 438/706
2005/0282382 A1* 12/2005 Ko et al. .................... 438/637
2005/0282394 A1* 12/2005 Chiba ........................ 438/711
2006/0134909 A1*  6/2006 Nagase et al. .............. 438/637

* cited by examiner

MULTIPLE LAYER RESIST SCHEME IMPLEMENTING ETCH RECIPE PARTICULAR TO EACH LAYER

BACKGROUND OF THE INVENTION

1. Technical Field

The present invention relates generally to photoresist schemes for semiconductor device fabrication, and more particularly, to a multiple layer resist scheme using etch recipes particular to each layer.

2. Related Art

In the semiconductor industry, achieving critical dimensions on structure is a continuing challenge as devices become smaller. One particular area that presents significant challenges relates to thin-wire line level (single) damascene processing of hydrogenated silicon oxy-carbide (SiCOH) based films for 90 nm and beyond technologies. More particularly, conventional single layer resist schemes do not provide the mechanisms necessary to achieve the required critical dimensions. For example, current technology may require target final critical dimension (FCD) values of 115 nm and 140 nm for the metal 1 (M1) level and the Mx+1 levels (x=1 to 5), respectively. Furthermore, current technology has desirable feature profiles such as 90° sidewalls, negligible hardmask faceting, and target line heights, which are difficult to achieve with current single layer resist schemes. The combination of utilizing a relatively thin layer of photoresist (300 nm) and etching a relatively robust carbon containing film (e.g., SiCOH) for the metal levels, i.e., M1 and Mx+1 levels (x=1 to 5), renders a particularly narrow resist budget for achieving the aforementioned objectives. Multiple layer resist schemes (bi-layer for example) have been applied to dual damascene processing, where they are required for but are limited by the application of a single etch recipe.

In view of the foregoing, there is a need in the art for an improved resist scheme to achieve the requisite critical dimensions.

SUMMARY OF THE INVENTION

The invention includes methods of forming a metal line and/or via critical dimension (CD) in a single or dual damascene process on a semiconductor substrate, and the resist scheme implemented. The method includes forming a multiple layer resist scheme including a first planarizing layer of a first type material over the substrate, a second dielectric layer of a second type material over the planarizing layer, and a third photoresist layer of a third type material over the dielectric layer. The types of material alternate between organic and inorganic material. Next, the third layer is patterned for the metal line and/or via critical dimension. Sequential etching to form the metal line and/or via critical dimension using a tailored etch recipe particular to each of the first photoresist layer, the second dielectric layer and the third planarizing layer as each layer is exposed is then used. The invention provides accurate CD formation and adequate resist budget.

A first aspect of the invention is directed to a method of forming a metal line critical dimension in a single damascene process on a semiconductor substrate, the method comprising the steps of: providing the semiconductor substrate including at least one metal level and at least one substrate dielectric layer thereover; forming a multiple layer resist scheme including a first layer of a first type material over the substrate, a second layer of a second type material over the first layer, and a third layer of a third type material over the second layer; patterning the third layer for the metal line critical dimension; and sequentially etching to form the metal line critical dimension using a different tailored etch recipe for each of the first, second and third layer.

A second aspect includes a method of forming a metal line critical dimension and a via critical dimension in a dual damascene process on a semiconductor substrate, the method comprising the steps of: providing the semiconductor substrate including at least one metal level and at least one dielectric layer thereover; forming a multiple layer resist scheme including a first layer of a first type material over the substrate, a second layer of a second type material over the first layer, and a third layer of a third type material over the second layer; patterning the third layer for the metal line critical dimension and the via critical dimension; and sequentially etching to form the metal line critical dimension and the via critical dimension using a different tailored etch recipe for each of the first, second and third layer.

A third aspect of the invention relates to a resist scheme for forming a wiring critical dimension in a single damascene process, the substrate including a metal level and at least one substrate dielectric layer thereover, the resist scheme comprising: a first layer of a first type material over the substrate; a second layer of a second type material over the first layer; and a third layer of a third type material over the second layer.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
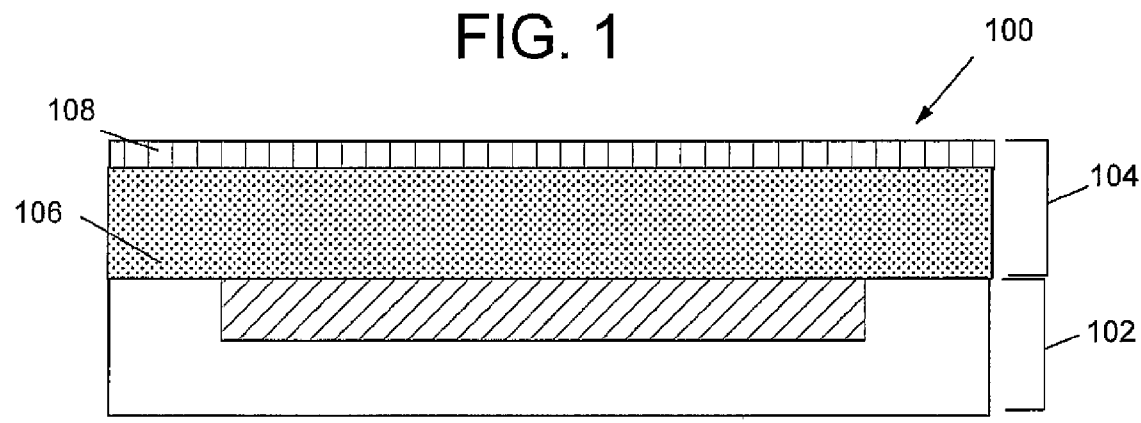
FIGS. 1-7 show a method according to one embodiment of the invention implementing a multiple layer resist scheme.
Figure 2:
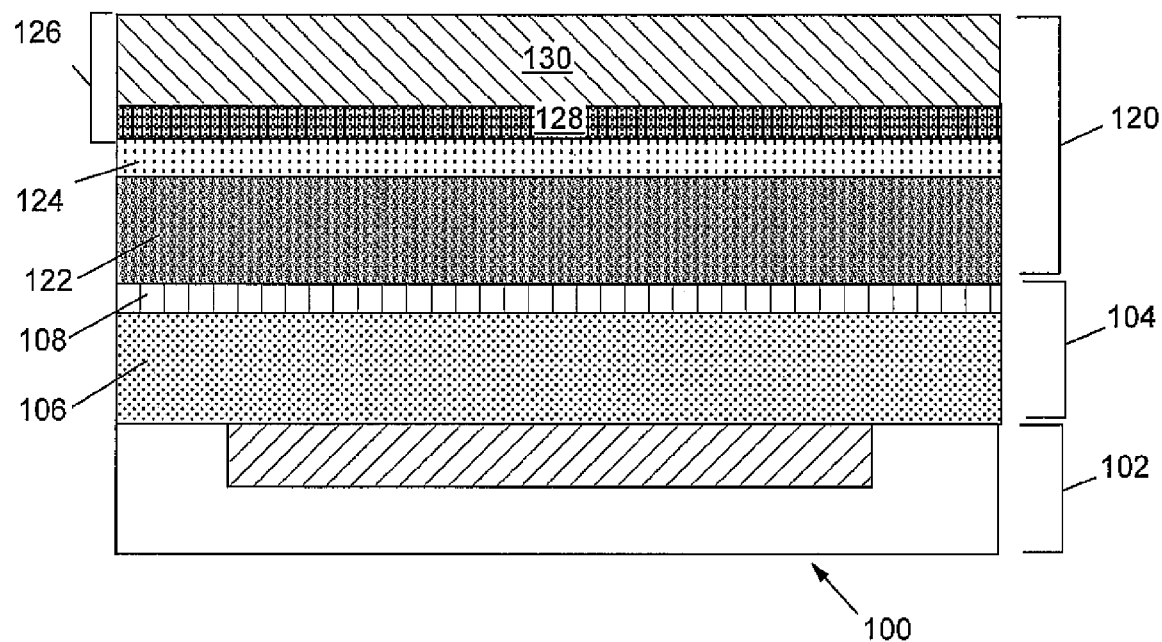

With reference to the accompanying drawings, FIG. 1 shows an initial step of a method according to one embodiment of the invention. In this embodiment, a metal line critical dimension (CD) is formed in a single damascene process on a semiconductor substrate 100. As illustrated, semiconductor substrate 100 is provided including at least one metal level 102 and at least one substrate dielectric layer 104 thereover. In one embodiment, substrate dielectric layer 104 includes two layers including a hydrogenated silicon oxy-carbide (SiCOH) layer 106 over metal level 102 and a hardmask layer 108, e.g., of oxide such as tetraethyl orthosilicate, $Si(OC_2H_5)_4$ (TEOS), silicon dioxide ($SiO_2$), silane oxide and thermal oxide. Other substrate dielectric layers such as silicon nitride ($Si_3N_4$) or silicon oxynitride (SiON) 102 may also be provided FIG. 2 shows a next step in which a multiple layer resist scheme 120 is formed. In one embodiment, multiple layer resist scheme 120 includes a triple layer scheme including a first planarizing layer 122 of a first type material over substrate 100, a second dielectric layer 124 of a second type material over planarizing layer 122, and a third photoresist layer 126 of a third type material over dielectric layer 124. In one embodiment, the types of materials alternate between organic and inorganic materials so as to provide different etching rates, as will be described below. In particular, in one embodiment, the first and third type material, i.e., of planarizing layer 122 and photoresist layer 126, include organic materials, and the second type material, i.e., of dielectric layer 124, includes an inorganic material. In this embodiment, planarizing layer 122 may include a poly(hydroxystyrene)-based system comprising poly(4-hydroxystyrene), 9-anthracenylmethylated poly(hydroxystyrene), tetrahydro-1,3,4,6-tetrakis(methoxymethyl)-imidazo[4,5-d]imidazole-2,5-(1H,3H)-dione, and p-nitrobenzyl tosylate (pNBT). Dielectric layer 124 may include an inorganic material such as any silicon dioxide material (e.g., a low temperature oxide (LTO), silicon oxynitride (SiON), thermal silicon dioxide, plasma-enhance chemical vapor deposited (PECVD) silicon dioxide and tetraethyl orthosilicate ($Si(OC_2H_5)_4$)(TEOS) silicon dioxide), silicon nitride ($Si_3N_4$) or any inorganic material. Photoresist layer 126 may include a 193 or 248 nm photoresist material layer 130, and an anti-reflective coating (ARC) 128.

Figure 3:
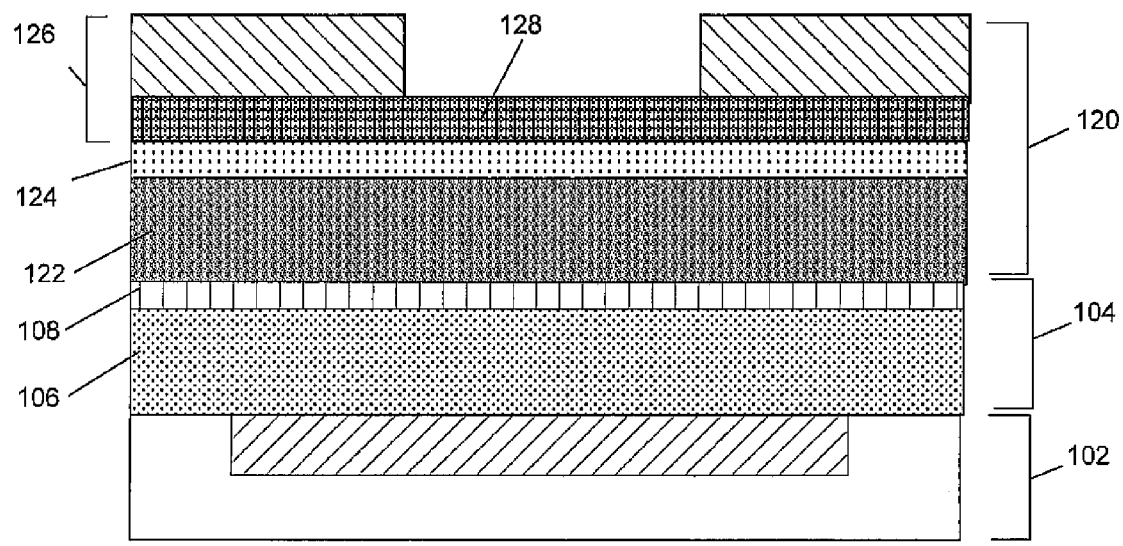

FIG. 3 shows a step of patterning photoresist layer 130 for the metal line critical dimension.

Figure 4:
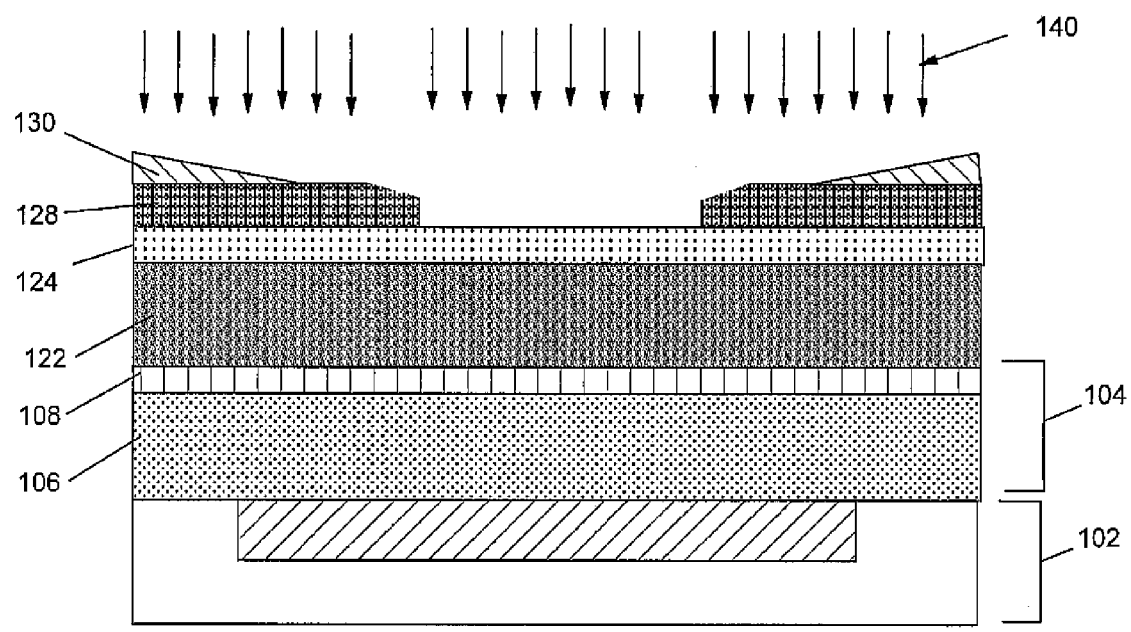
Figure 5:
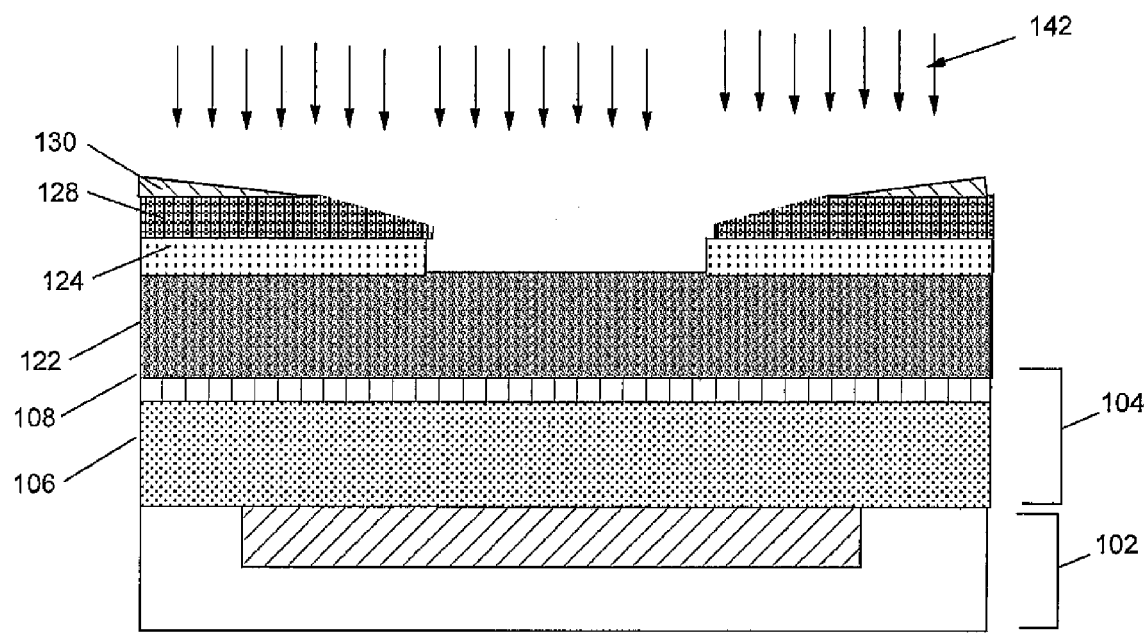
Figure 6:
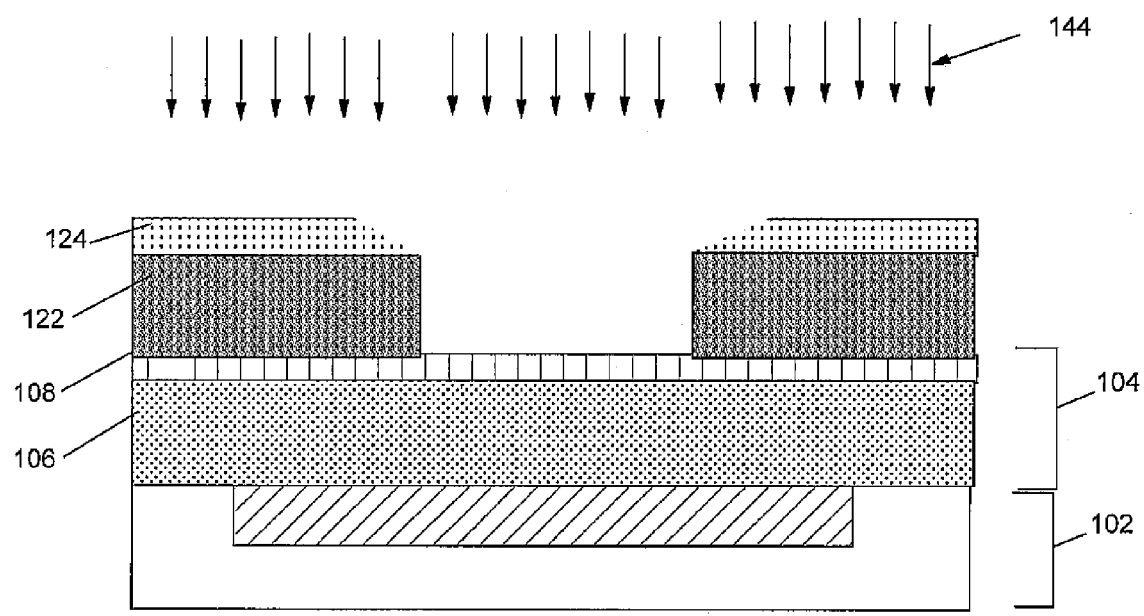
Figure 7:
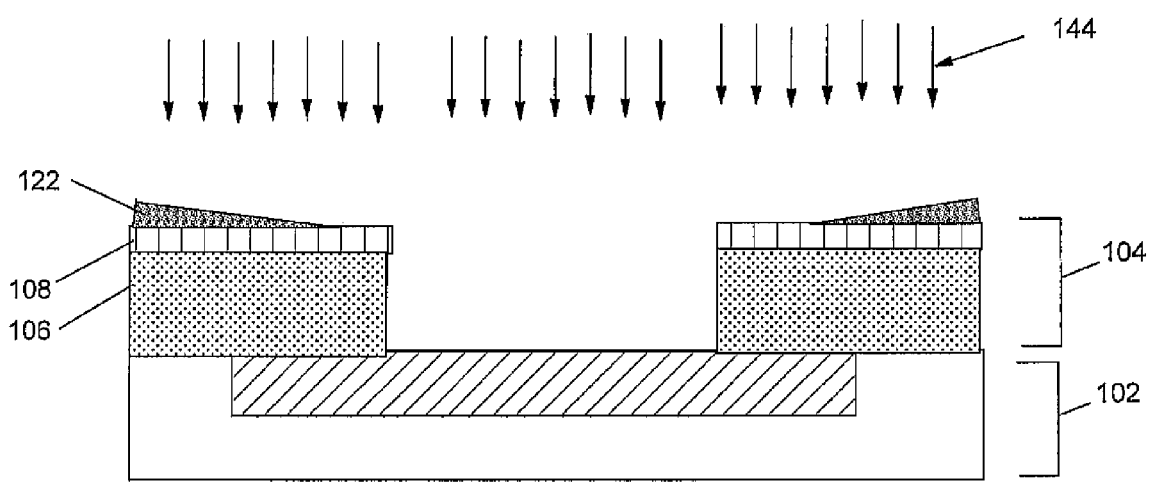

Next, as shown in FIGS. 4-7, a sequentially etching is performed to form the metal line critical dimension using a different, tailored etch recipe 140, 142, 144 particular for each of photoresist layer 126, dielectric layer 124 and planarizing layer 122 as each layer 122, 124, 126 is exposed. The etching step removes each of: photoresist layer 126 (i.e., layers 128, 130 as shown in FIG. 4) using a first etching recipe 140, dielectric layer 124 (as shown in FIG. 5) using a second etching recipe 142, and planarizing layer 122 (FIG. 6) using a third etching recipe 144. First etching recipe 140 for photoresist layer 126 may include any oxygen containing chemistry (including, e.g., oxygen $O_2$, carbon monoxide (CO), carbon dioxide ($CO_2$) or combinations thereof), and/or a reducing type chemistry (including, e.g., nitrogen ($N_2$), hydrogen ($H_2$), or ammonia ($NH_3$) or combinations thereof) coupled with some type of depositing gas (including, e.g., fluoro methane ($CH_3F$), difluoro methane ($CH_2F_2$), trifluoro methane ($CHF_3$) or combinations thereof). Second etch recipe 142 for dielectric layer 124 may include any fluorine based chemistry (including, e.g., tetrafluoro methane ($CF_4$), trifluoro methane ($CHF_3$), perfluoro-2-butene ($C_4F_8$) or combinations thereof) process. Third etch recipe 144 for planarizing layer 122 is similar to that used to etch the photoresist layer and may include any oxygen containing (including, e.g., oxygen $O_2$, carbon monoxide (CO), carbon dioxide ($CO_2$) or combinations thereof) and/or reducing type chemistry (including, e.g., nitrogen ($N_2$), hydrogen ($H_2$), or ammonia ($NH_3$) or combinations thereof) coupled with some type of depositing gas (including, e.g., fluoro methane ($CH_3F$), difluoro methane ($CH_2F_2$), trifluoro methane ($CHF_3$) or combinations thereof). It should be recognized that the etch recipe would vary depending on the type of material used, e.g., the etch recipes would vary if the order of organic and inorganic material varied. In addition to different etch recipes, each etching may employ different process conditions, e.g., pressure, temperature, radio frequency (RF) energy, etc. FIG. 7 illustrates the continuation of third etch recipe 144 as it opens substrate dielectric layer 104, i.e., SiCOH layer 106 and hardmask layer 108.

In operation, the multiple layer resist scheme 120 and specific etch processes are used to increase "resist" budget for the metal one level (M1) and other metal levels (Mx+1) etch processes. In addition, resist scheme 120 allows for significant CD tunability via the application of specific etch processes for etching each of the 3 layers, and enables target structural profiles. Since there are potentially three distinct processes applied in the creation of the line level structure for etching each of these 3 layers, this facilitates increased potential to adjust line CDs to desired target values by employing different process conditions for each of these processing steps. Further, since resist scheme 120 preferably alternates between organic and inorganic type materials, the etching of one type of film (e.g., planarizing layer 122 (organic)) is usually very selective to the underlying and "opposite" material (e.g., oxide hardmask layer 108 of substrate dielectric layer 104 in this case). In addition, the etching is commensurate with the consumption of the "identical" film in the field area (e.g., organic photoresist layer 126). The results of the above-described etching process is that a sufficient etch process window is provided to tailor the etch conditions for each layer to deliver a final target CDs and target structural profiles. It should be recognized that while specific layers have been used to enable this invention, any organic/inorganic/organic type material stack can facilitate this unique feature. In addition, the thicknesses of material may vary. One example implementation used the following materials and thicknesses: 300 nm of 193 nm wavelength photoresist layer 128 (e.g., JSR 414 available from JSR Inc.); 90 nm ARC layer 128; 80 nm LTO for dielectric layer 124; 450 nm near-frictionless carbon (NFC) for planarizing layer 122; 60 nm TEOS for hardmask layer 108; and 490 nm (for Mx+1) or 180 nm (for M1) of SiCOH layer 106.

Figure 8:
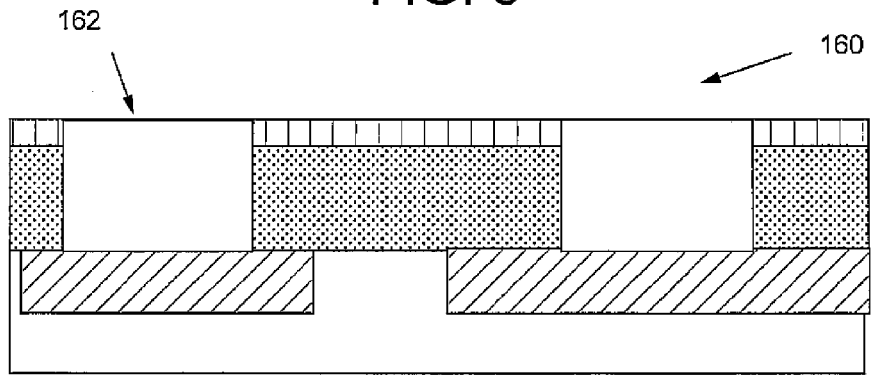
FIG. 8 shows the result of a method according to another embodiment of the invention implementing a multiple layer resist scheme.

Turning to FIG. 8, the results of another embodiment of the invention of a method of forming a metal line 160 critical dimension and a via 162 critical dimension in a dual damascene process is illustrated. The steps of this embodiment are substantially the same as described above except for the addition of patterning third layer 126 for both the metal line critical dimension and the via critical dimension.

The invention also includes resist scheme 120 for forming a wiring critical dimension in a single damascene process, the substrate 100 including a metal level 102 and at least one substrate dielectric layer 104 thereover. As described above, resist scheme 120 includes a first layer 122 of a first type material over substrate 100; a second layer 124 of a second type material over the first layer 122; a third layer of a third type material over second layer 124; and a pattern (FIG. 3) extending through each of the layers for the wiring critical dimension.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming a metal line critical dimension in a single damascene process on a semiconductor substrate, the method comprising the steps of:

providing the semiconductor substrate including at least one metal level and at least one substrate dielectric layer thereover,
wherein the at least one substrate dielectric layer includes a hardmask layer over a hydrogenated silicon oxy-carbide (SiCOH) layer;

forming a multiple layer resist scheme including a first layer of a first type material over the substrate, a second layer of a second type material over the first layer, and a third layer of a third type material over the second layer, wherein the first layer includes a planarizing layer, the second layer includes a dielectric layer, and the third layer includes a photoresist, and the first, second, and third types of materials alternate between organic and inorganic material;

patterning the third layer for the metal line critical dimension; and sequentially etching to form the metal line critical dimension using a different tailored etch recipe for each of the first, second and third layer, and employing different process conditions for each etching.

2. The method of claim 1, wherein the first and third type material includes organic materials, and the second type material includes inorganic material.

3. The method of claim 1, wherein the first layer includes a near-frictionless carbon (NFC) material, the second layer includes an inorganic silicon dioxide material.

4. A method of forming a metal line critical dimension and a via critical dimension in a dual damascene process on a semiconductor substrate, the method comprising the steps of:

providing the semiconductor substrate including at least one metal level and at least one dielectric layer thereover, wherein the at least one dielectric layer includes a hardmask layer over a hydrogenated silicon oxy-carbide (SiCOH) layer;

forming a multiple layer resist scheme including a first layer of a first type material over the substrate, a second layer of a second type material over the first layer, and a third layer of a third type material over the second layer, wherein the first layer includes a planarizing layer, the second layer includes a dielectric layer, and the third layer includes a photoresist, and wherein the first, second and third types of materials alternate between organic and inorganic material;

patterning the third layer for the metal line critical dimension and the via critical dimension; and sequentially etching to form the metal line critical dimension and the via critical dimension using a different tailored etch recipe for each of the first, second and third layer.

5. The method of claim 4, wherein the first and third type material include organic materials, and the second type material includes inorganic material.

6. The method of claim 4, wherein the first layer includes a near-frictionless carbon (NFC) material, the second layer includes an inorganic silicon dioxide material.

7. A resist scheme for forming a wiring critical dimension in a single damascene process on a semiconductor substrate, the substrate including a metal level and at least one substrate dielectric layer thereover, the resist scheme comprising:

a first layer of a first type material over the substrate, the first layer including an organic planarizing layer, wherein the first layer includes a near-frictionless carbon (NFC) material;

a second layer of a second type material over the first layer, the second layer including an inorganic dielectric layer, wherein the inorganic dielectric layer includes one of: a low temperature oxide (LTO), silicon oxynitride (SiON), silicon nitride ($Si_3N_4$), and silicon dioxide selected from the group consisting of thermal silicon dioxide, plasma-enhance chemical vapor deposited (PECVD) silicon dioxide and tetraethyl orthosilicate ($Si(OC_2H_5)_4$)(TEOS) silicon dioxide; and a third layer of a third type material over the second layer, the third layer including an organic photoresist;

wherein the at least one substrate dielectric layer includes a hardmask layer including one of: tetraethyl orthosilicate ($Si(OC_2H_5)_4$) silicon dioxide, silane oxide and thermal oxide, the hardmask layer provided over a hydrogenated silicon oxy-carbide (SiCOH) layer.

* * * * *